United States Patent [19]
Wu

[11] Patent Number: 5,946,583
[45] Date of Patent: Aug. 31, 1999

[54] METHOD FOR PREVENTING ALIGNMENT MARKS FROM DISAPPEARING AFTER CHEMICAL MECHANICAL POLISHING

[75] Inventor: Chi-Hsi Wu, Hsinchu, Taiwan

[73] Assignee: Winbond Electronics Corporation, Hsinchu, Taiwan

[21] Appl. No.: 08/972,316

[22] Filed: Nov. 18, 1997

[51] Int. Cl.⁶ .................................................. H01L 21/76
[52] U.S. Cl. ........................................... 438/401; 438/462
[58] Field of Search .................................. 438/401, 462, 438/633; 257/797

[56] References Cited

U.S. PATENT DOCUMENTS

| | | | |
|---|---|---|---|
| 5,401,691 | 3/1995 | Caldwell | 438/633 |
| 5,640,053 | 6/1997 | Caldwell | 257/797 |

*Primary Examiner*—Chandra Chaudhari
*Assistant Examiner*—Craig Thompson
*Attorney, Agent, or Firm*—Fish & Richardson P.C.

[57] ABSTRACT

A method for preventing alignment marks from disappearing after chemical mechanical polishing according to the invention is disclosed. This method, suitable for a substrate on which devices and first alignment marks are already formed, comprise: forming a metal layer on the substrate, thereby forming second alignment marks on the metal layer above the first alignment marks; forming a required metal pattern on the metal layer and removing part of the metal layer on the first alignment marks; forming a first dielectric layer, an etching stop and a second dielectric layer over the substrate, thereby forming third alignment marks, fourth alignment marks and fifth alignment marks on the first dielectric layer, etching stop and second dielectric layer, respectively; performing chemical mechanical polishing, causing the disappearance of the fifth alignment marks; and forming contact windows in the first dielectric layer and clear out windows on the fourth alignment marks to make said fourth alignment marks reappear. Furthermore, the method for preventing alignment marks from disappearing after chemical mechanical polishing according to the invention not only makes the required alignment marks reappear, but also simplifies the semiconductor process, that is, unlike the prior art, no extra photolithography and etching is required in the invention, because the contact windows and clear out windows are formed simultaneously.

9 Claims, 10 Drawing Sheets

METHOD FOR PREVENTING ALIGNMENT MARKS FROM DISAPPEARING AFTER CHEMICAL MECHANICAL POLISHING

BACKGROUND OF THE INVENTION

1. Field of the Invention

The invention relates to a semiconductor process, and more particularly to a method for preventing alignment marks from disappearing after a chemical mechanical polishing (CMP) process.

2. Description of the Prior Art

Currently, in a semiconductor process, high overlap accuracy of optical aligner machines is quite important. In general, different optical aligner machines use different alignment approaches, with the ASML optical aligner machine being one of the more widely used in the semiconductor industry. Referring to FIG. 1, the principle of alignment used by the ASML optical aligner machine is to locate two alignment marks 10 which are disposed at two different locations of a wafer 11 using an optical approach. A cross-sectional view of an alignment mark 10 is shown in FIG. 2. Typically, the two alignment marks would not be destroyed in a front-end process, allowing the optical alignment to be readily accomplished. Furthermore, in the past, since no planarization step was executed in a back-end process, the alignment marks would not be harmed or removed. However, after chemical mechanical polishing processes were introduced into the semiconductor fabrication process, optical aligner machines could not easily locate the alignment marks, and in some cases, could not find the alignment marks at all, resulting in an alignment error or a non-alignment problem. A method for solving the above-mentioned problem according to the prior art will be described as follows.

First, referring to FIG. 3A, a dielectric layer 32 which is semi-transparent is deposited on a substrate 30 on which first alignment marks 31 are already formed so that second alignment marks 33 positioned directly over the first alignment marks 31 are formed on the dielectric layer 32. Referring to FIG. 3B, chemical mechanical polishing (CMP) is performed on the dielectric layer 32, resulting in the disappearance of second alignment marks 33. Referring to FIG. 3C, a first metal layer 34 is deposited on the dielectric layer 32 and then a first photoresist layer 35 is formed on the first metal layer 34 excepting that part of the first metal layer 34 over the first alignment marks 31. Referring to FIG. 3D, plasma etching is performed in order to form a first "metal clear out window" 301 over the first alignment marks 31, thereby exposing the first alignment marks 31 required for subsequent optical alignment of the first metal layer 34. Referring to FIG. 3E, a second photoresist 36 is formed on a part of the first metal layer 34. Referring to FIG. 3F, plasma etching is performed in order to form a desired metal pattern by removing a part of the first metal layer 34. Referring to FIG. 3G, a planarized dielectric layer 37 and second metal layer 38 are formed in order over the dielectric layer 32 and then a third photoresist 39 is formed on the second metal layer 38 excepting that part of the second metal layer 38 over the first alignment marks 31. Finally, referring to FIG. 3H, plasma etching is performed in order to form a required second "metal clear out window" 302 over the first alignment marks 31 by removing a part of the second metal layer 38 over the first alignment marks 31, thereby allowing the first alignment marks 31 to be exposed for use in subsequent optical alignment of the second metal layer 38. As is apparent from the above description, once a metal layer is deposited, extra photolithography and plasma etching processes are required in order to form a "metal clear out window", and thereby expose the alignment mark. However, this process is relatively complicated and requires a substantial amount of time for fabrication.

SUMMARY OF THE INVENTION

In order to resolve the above-mentioned problem, the object of the invention is to provide a method for efficiently preventing alignment marks from disappearing after chemical mechanical polishing. This method is suitable for a substrate on which devices and first alignment marks are already formed. In this method, a metal layer is first formed on the substrate, thereby forming second alignment marks on the metal layer above the first alignment marks. Then, a required pattern is formed on the metal layer and part of the metal layer on the first alignment marks is removed. After that, a first dielectric layer, an etching stop and a second dielectric layer are formed over the substrate, thereby forming third alignment marks, fourth alignment marks and fifth alignment marks on the first dielectric layer, etching stop and second dielectric layer, respectively. Subsequently, chemical mechanical polishing is performed to cause the disappearance of the fifth alignment marks. Finally, contact windows are formed in the first dielectric layer and clear out windows are formed on the fourth alignment marks to make the fourth alignment marks reappear. Furthermore, the method for preventing alignment marks from disappearing after chemical mechanical polishing according to the invention not only makes the required alignment marks reappear, but also simplifies the semiconductor process, that is, unlike the prior art, no extra photolithography and etching is required in the invention, because the contact windows and clear out windows are formed simultaneously.

BRIEF DESCRIPTION OF THE DRAWINGS

The objects, characteristics, and advantages of the present invention will be explained clearly by using a preferred embodiment with pertinent drawings as follows:

FIGS. 4A–4I are cross-sectional views illustrating a method for preventing alignment marks from disappearing after chemical mechanical polishing according to a preferred embodiment of the invention.

DETAILED DESCRIPTION OF THE INVENTION

In one embodiment of the invention, a method for preventing alignment marks from disappearing after a chemical mechanical polishing process, suitable for a substrate 40 on which devices (not shown in FIGS. 4A–4I) and first alignment marks 41 are already formed is described as follows. Alignment marks 41 are of the type formed as raised formations which extend above the surface of substrate 40.

Figure 1:
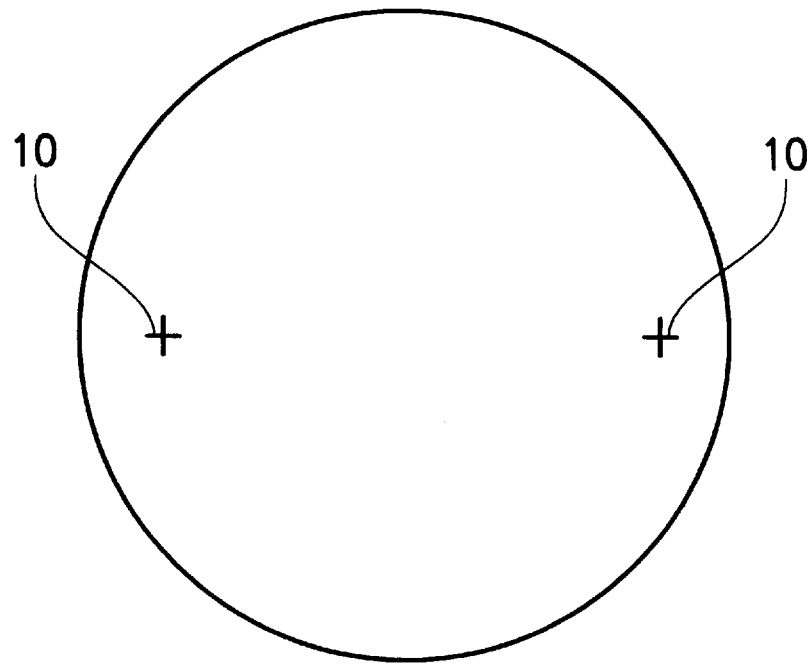
FIG. 1 is a schematic plan view illustrating the positions of alignment marks on a wafer.
Figure 2:
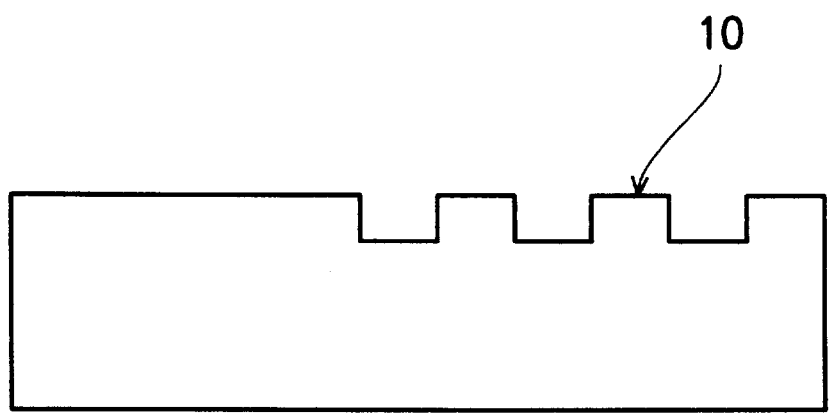
FIG. 2 is a cross-sectional view illustrating an alignment mark.
Figure 3A:
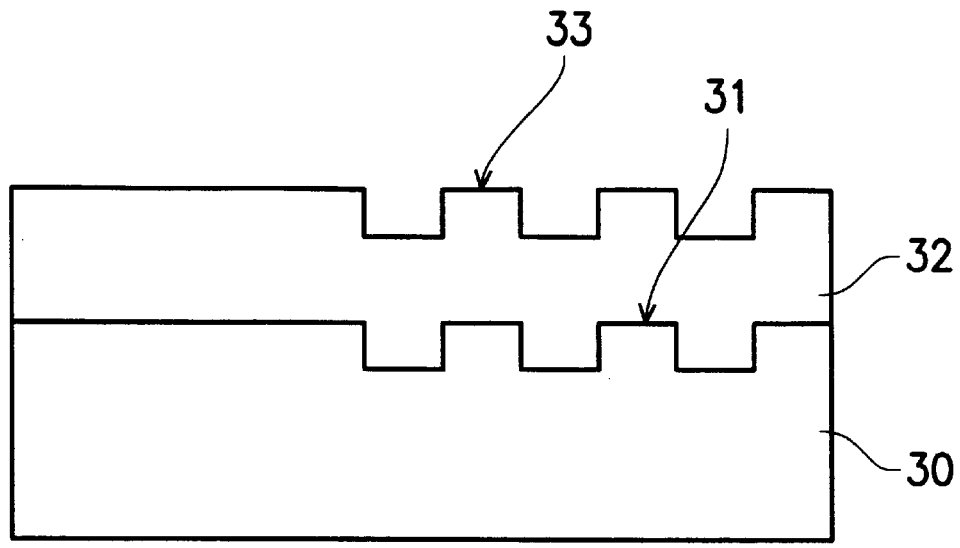
FIGS. 3A–3H are cross-sectional views illustrating a method for preventing alignment marks from disappearing after chemical mechanical polishing according to the prior art.
Figure 3B:
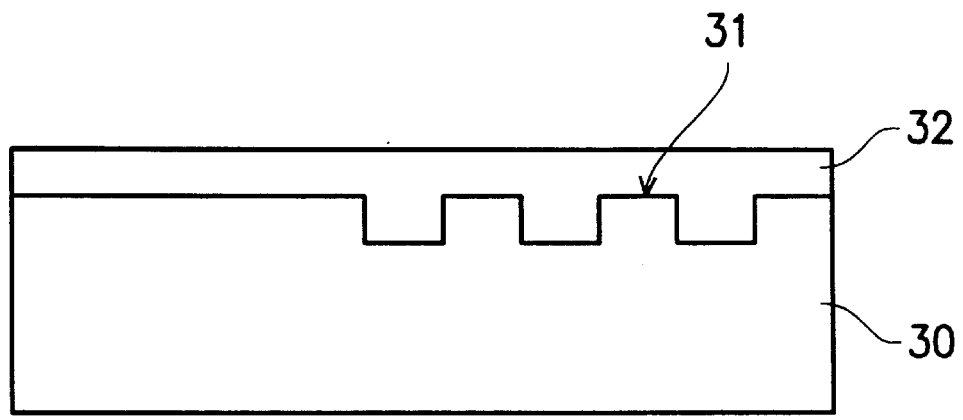
Figure 3C:
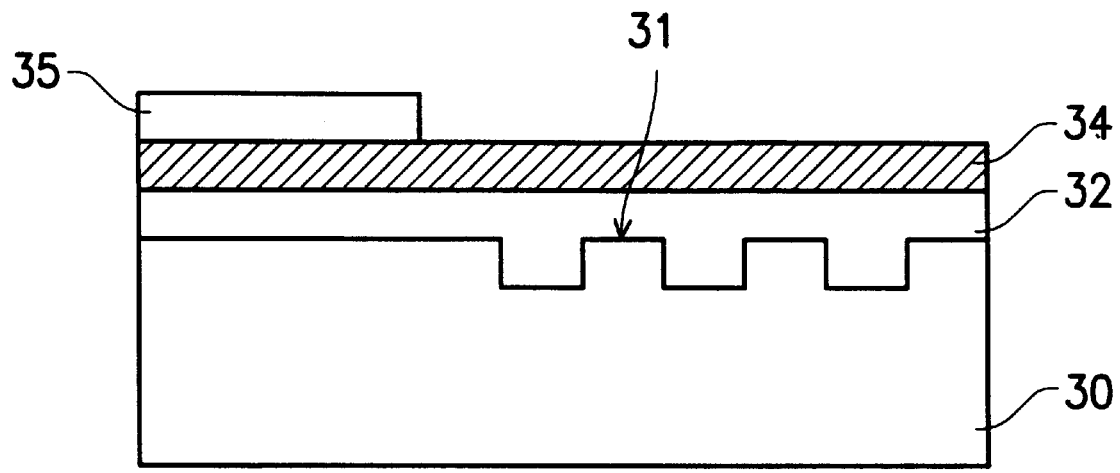
Figure 3D:
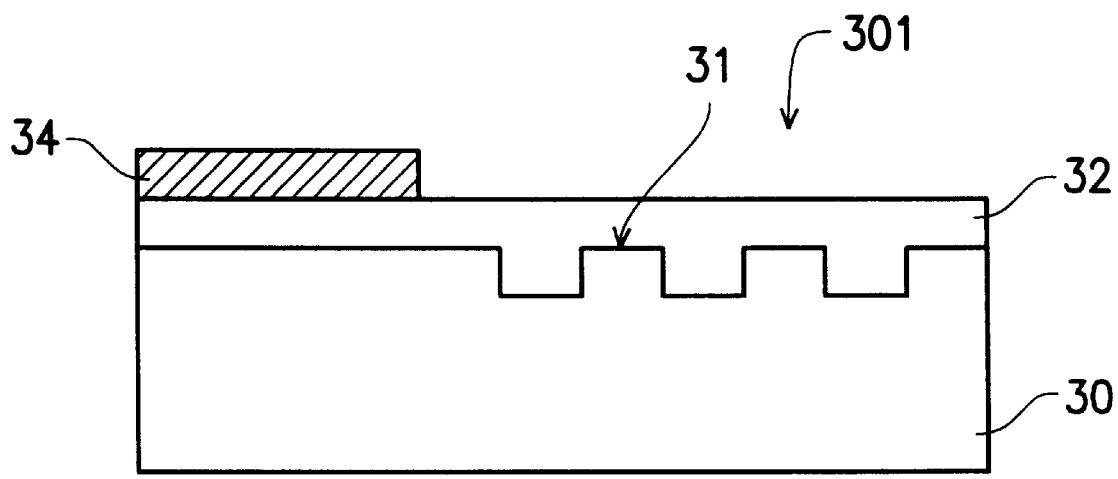
Figure 3E:
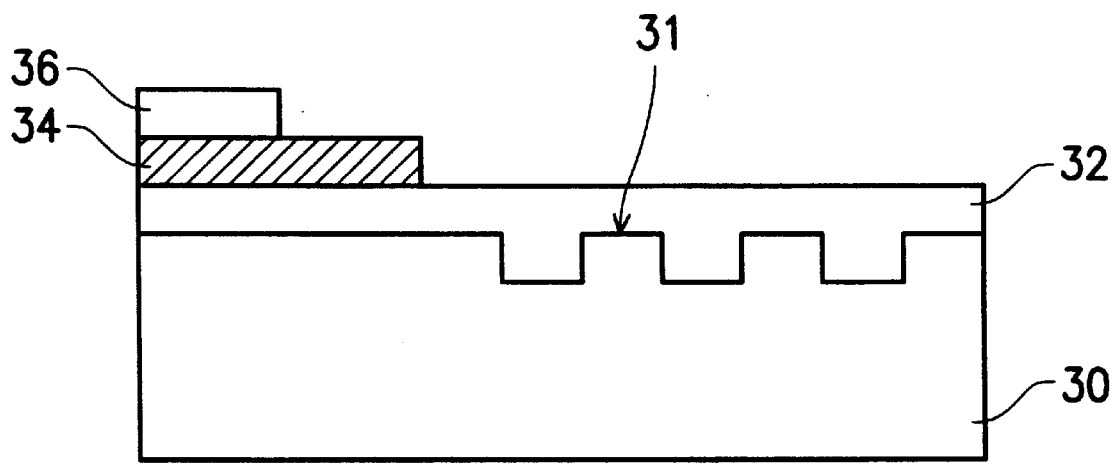
Figure 3F:
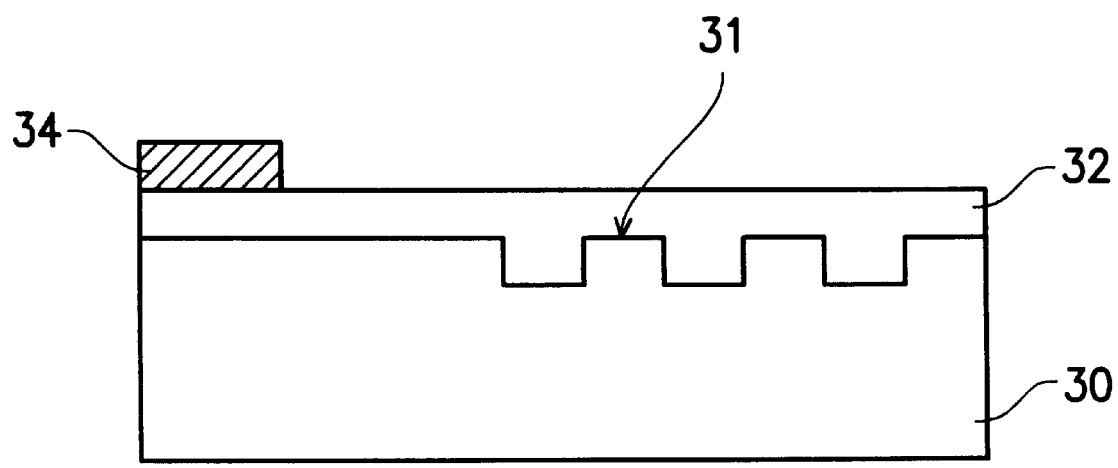
Figure 3G:
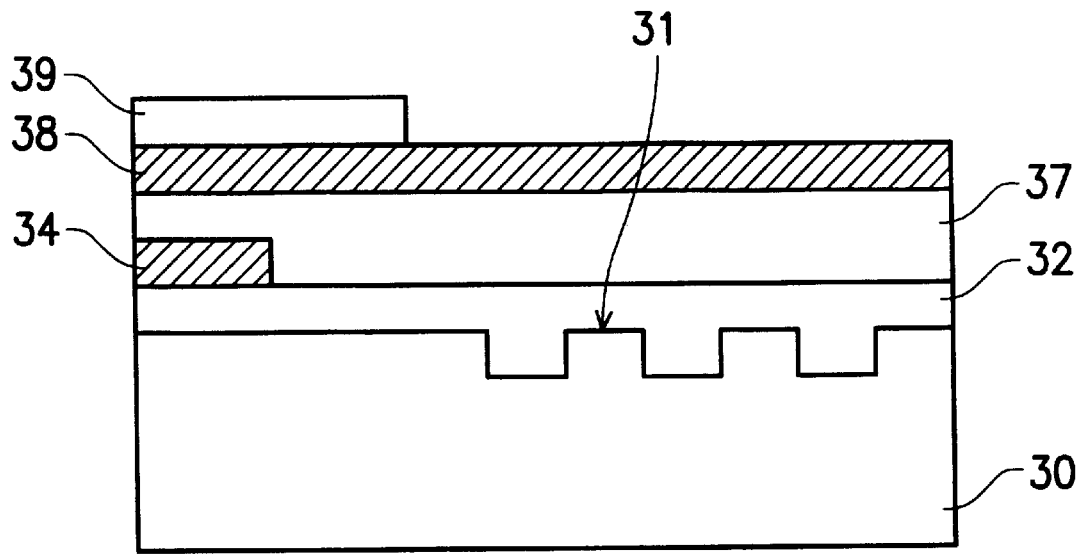
Figure 3H:
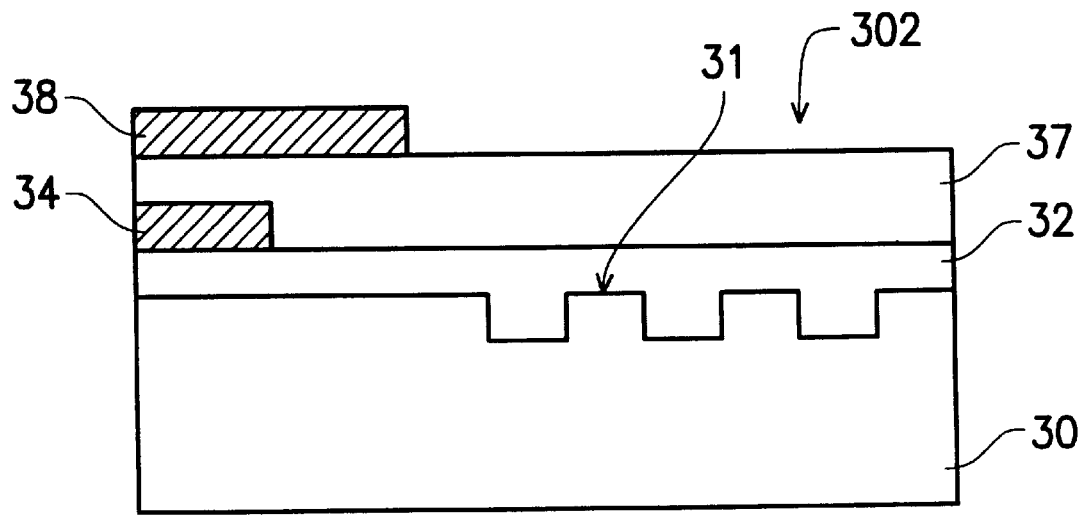
Figure 4A:
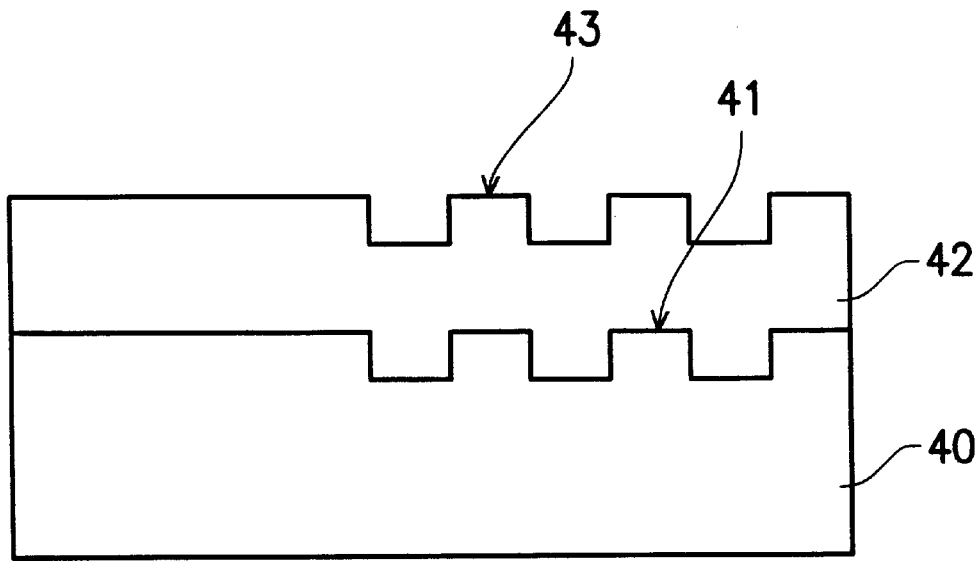
Figure 4B:
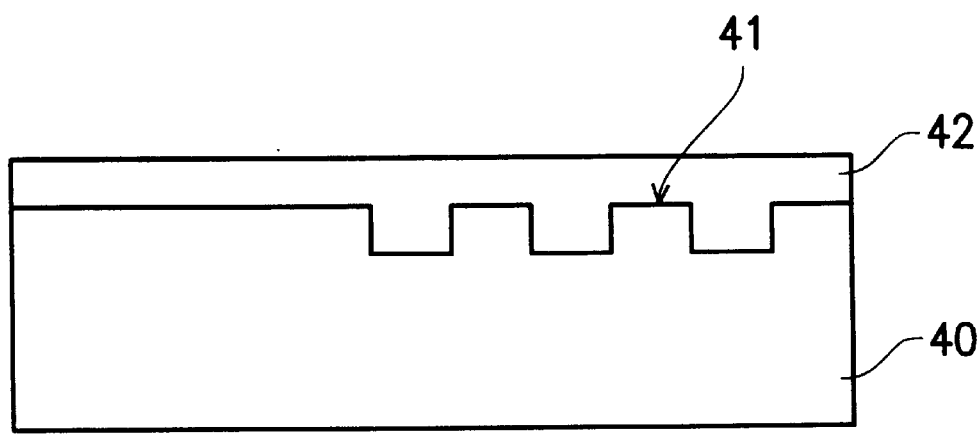
Figure 4C:
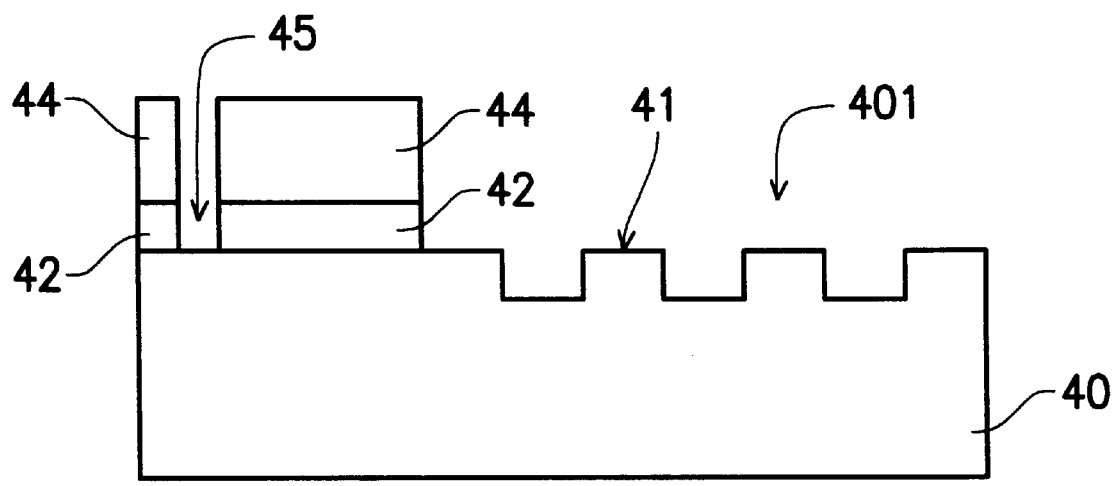
Figure 4D:
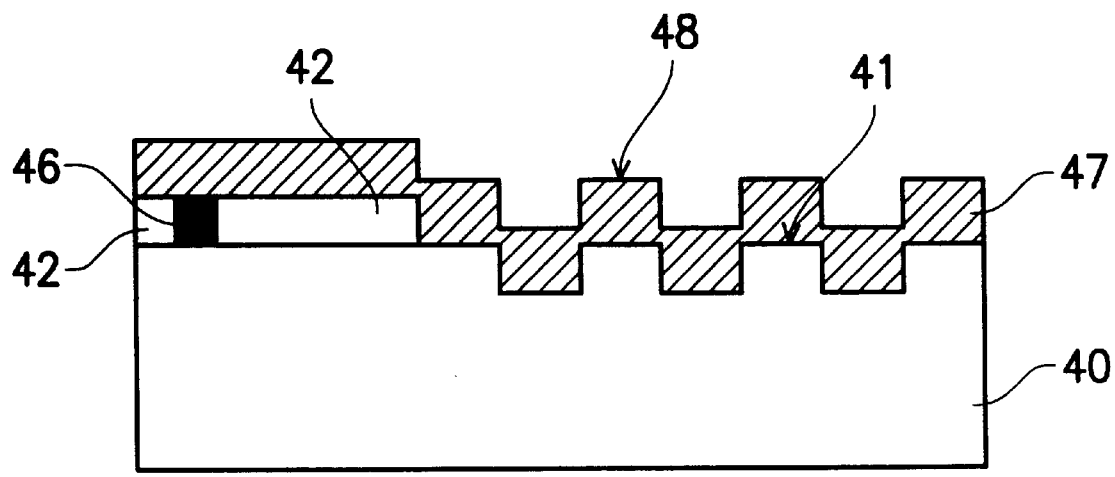

Referring to FIG. 4A, a first oxide layer 42 is deposited on substrate 40 by chemical vapor deposition, thereby simultaneously forming second alignment marks 43 on a part of the first oxide layer 42 and aligned over the first alignment marks 41. Referring to FIG. 4B, performing chemical mechanical polishing, results in the removal of the second alignment marks 43. Referring to FIG. 4C, a first photoresist layer 44 is formed on the first oxide layer 42 by photolithography and then a first contact window 45 in the first oxide layer 42 and first clear out window 401 over the first alignment marks 41 are formed by plasma etching. Referring to FIG. 4D, a first tungsten plug layer 46 is formed within the first contact window 45 by chemical vapor deposition, and then a first aluminum layer 47, for example, an aluminum layer is formed over the substrate 40, thereby simultaneously forming third alignment marks 48 on a part of the first aluminum layer 47 and aligned over the first alignment marks 41.

Figure 4E:
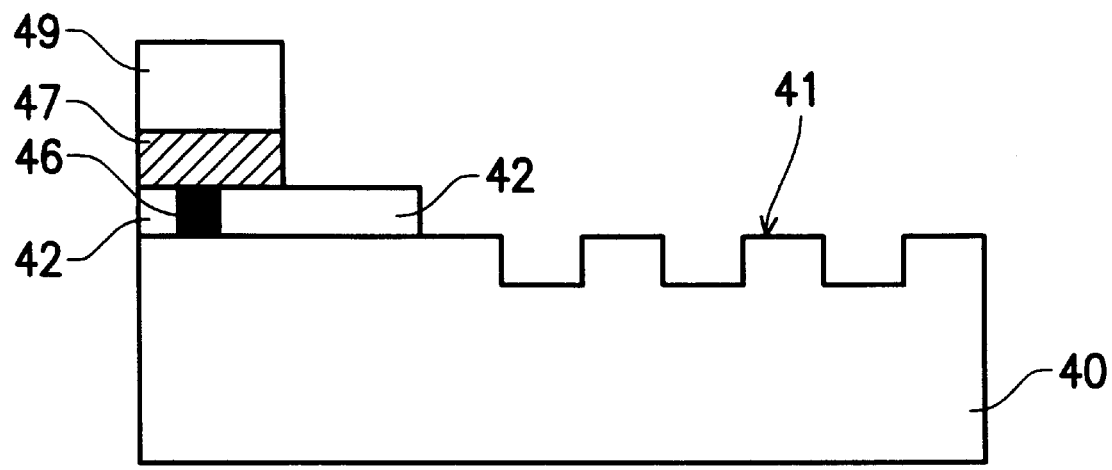
Figure 4F:
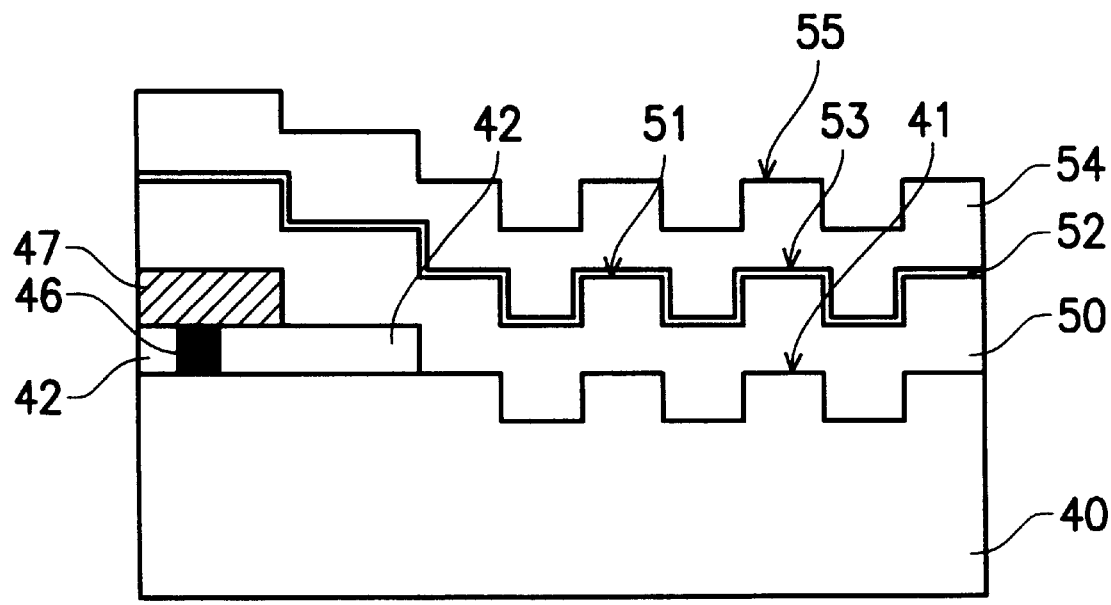

Referring to FIG. 4E, a second photoresist layer 49 is formed on the first aluminum layer 47 by photolithography, and then plasma etching is performed to remove a part of the first aluminum layer 47 over the first alignment marks 41 and to form a desired metal pattern on the first aluminum layer 47. Referring to FIG. 4F, second photoresist layer 49 is removed and a second oxide layer 50 with a thickness of 1 K~5 KÅ, etching stop (for example, silicon nitride layer) 52 with a thickness of 100~3,000Å and third oxide layer 54 with a thickness of 5 K~20 KÅ are formed successively over substrate 40, thereby forming fourth alignment marks 51, fifth alignment marks 53, and sixth alignment marks 55 on the second oxide layer 50, silicon nitride layer 52, and third oxide layer 54, respectively, each aligned over first alignment marks 41, with silicon nitride layer 52 having an etch stop function.

Figure 4G:
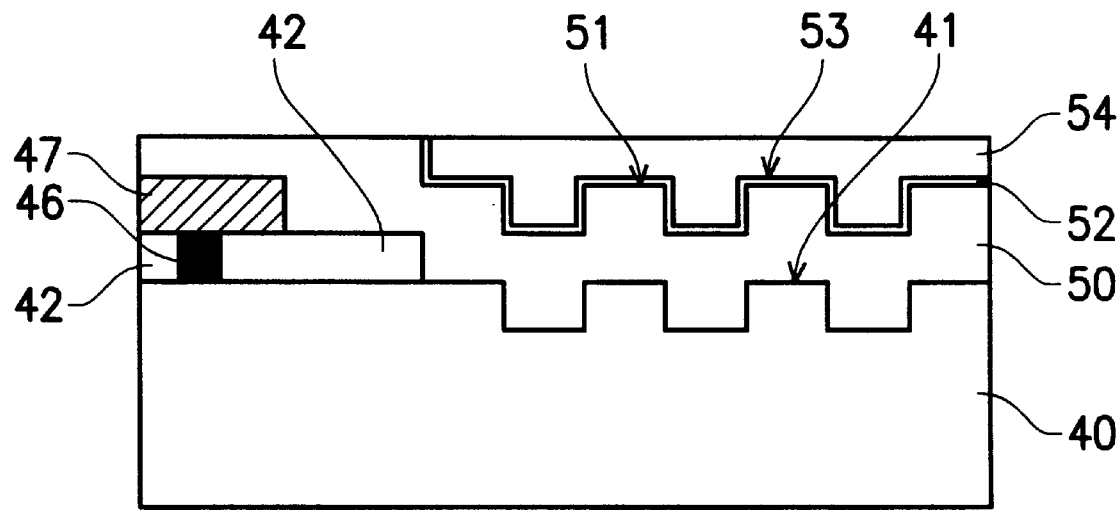
Figure 4H:
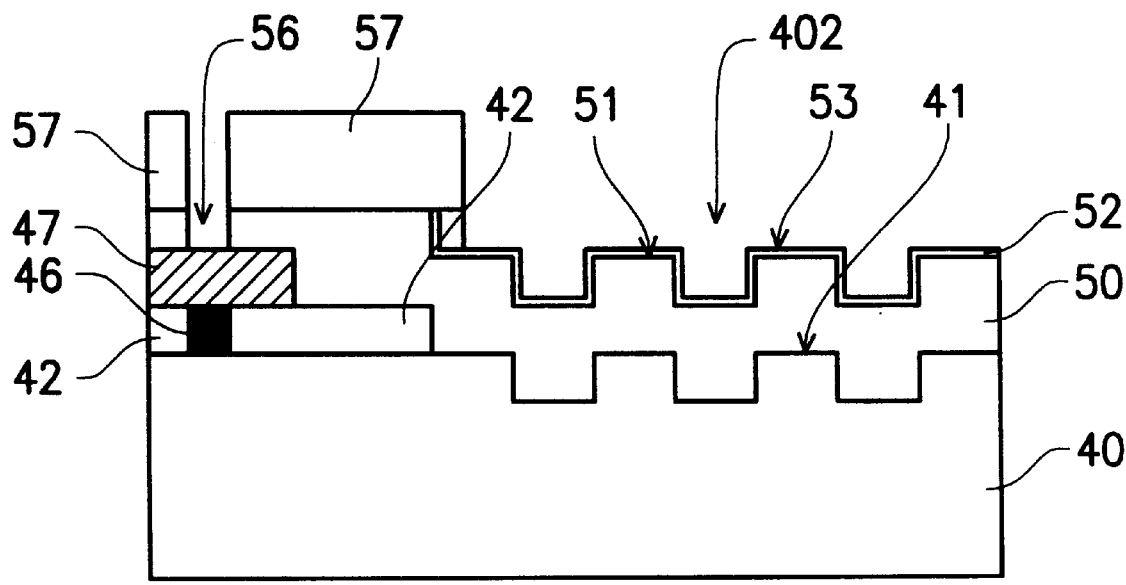
Figure 41:
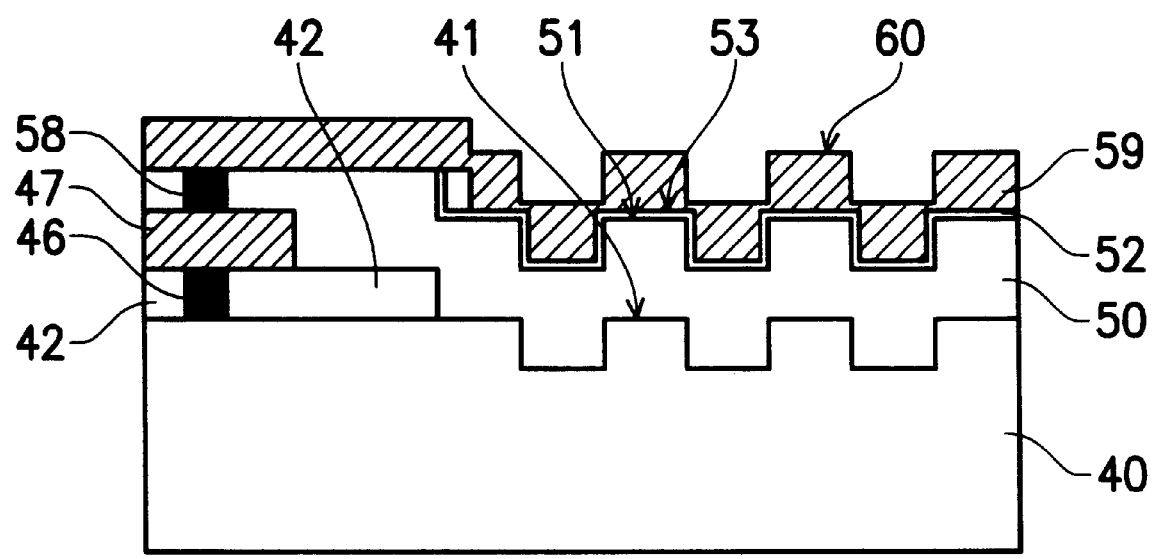

Referring to FIG. 4G, chemical mechanical polishing is performed until sixth alignment marks 55 are removed. Referring to FIG. 4H, a third photoresist layer 56 is formed over a portion of second oxide layer 50 and third oxide layer 54 by photo lithography and then plasma etching, in which the etching rate of the second oxide layer 50 much larger than those of the silicon nitride layer 52 and first aluminum layer 47 by adjusting etching recipe, is performed to form a second contact window 57 over tungsten plug 46 and through a portion of second oxide layer 50 and third photoresist layer 56. This plasma etching step also removes third oxide layer 54, thereby forming second clear out windows 402 above fifth alignment marks 53. During the plasma etching of third oxide layer 54, silicon nitride layer 52 serves as an etch stop layer, maintaining the fifth alignment marks 53. Finally, referring to FIG. 4I, a second tungsten plug layer 58 is formed within second contact window 57 by chemical vapor deposition and then a second aluminum layer 59, for example, an aluminum layer is formed over the substrate 40, forming seventh alignment marks 60 disposed and aligned over the fifth alignment marks 53 for subsequent optical alignment of the second aluminum layer 59. The above-mentioned steps shown in FIG. 4E through FIG. 4I are then repeated.

It is appreciated that although only a single alignment mark and clear out window is shown in FIGS. 4A–4I, at least two alignment marks are required to be formed on the wafer.

Based on the above description, a method for preventing alignment marks from disappearing a chemical mechanical polishing process according to an embodiment of the invention ensures that the required alignment marks are provided, but also simplifies the semiconductor process. In particular, unlike the prior art, no extra photolithography and etching is required in the invention, because the contact window and clear out windows are formed simultaneously as shown in FIG. 4E through FIG. 4I.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A method for preventing alignment marks from disappearing after chemical mechanical polishing, suitable for a substrate on which devices and first alignment marks are already formed, comprising:

forming a first dielectric layer, an etching stop and a second dielectric layer on said substrate, thereby forming second alignment marks, third alignment marks and fourth alignment marks on said first dielectric layer, said etching stop and said second dielectric layer, respectively;

performing chemical mechanical polishing, causing the disappearance of said fourth alignment marks; and forming clear out windows on said third alignment marks to make said third alignment marks reappear.

2. The method for preventing alignment marks from disappearing after chemical mechanical polishing of claim 1, wherein said first dielectric layer is an oxide layer.

3. The method for preventing alignment marks from disappearing after chemical mechanical polishing of claim 1, wherein the thickness of said first dielectric layer is 1 K~5 KÅ.

4. The method for preventing alignment marks from disappearing after chemical mechanical polishing of claim 1, wherein said etching stop is a silicon nitride layer.

5. The method for preventing alignment marks from disappearing after chemical mechanical polishing of claim 1, wherein the thickness of said etching stop is 100~3,000Å.

6. The method for preventing alignment marks from disappearing after chemical mechanical polishing of claim 1, wherein said second dielectric layer is an oxide layer.

7. The method for preventing alignment marks from disappearing after chemical mechanical polishing of claim 1, wherein the thickness of said second dielectric layer is 5 K~20 KÅ.

8. The method for preventing alignment marks from disappearing after chemical mechanical polishing of claim 1, wherein said first dielectric layer, said etching stop and said second dielectric layer are formed by use of chemical vapor deposition.

9. The method for preventing alignment marks from disappearing after chemical mechanical polishing of claim 1, wherein said clear out windows are formed by use of photolithography and plasma etching.

* * * * *